(12) United States Patent
Roohparvar

(10) Patent No.: US 7,483,330 B2
(45) Date of Patent: Jan. 27, 2009

(54) POWER EFFICIENT MEMORY AND CARDS

(75) Inventor: Frankie F. Roohparvar, Monte Sereno, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/691,817

(22) Filed: Mar. 27, 2007

(65) Prior Publication Data

US 2007/0189099 A1    Aug. 16, 2007

Related U.S. Application Data

(62) Division of application No. 10/930,524, filed on Aug. 31, 2004, now Pat. No. 7,196,958.

(51) Int. Cl.
*G11C 5/14* (2006.01)

(52) U.S. Cl. .................. 365/226; 365/229; 365/227

(58) Field of Classification Search ............... 365/226, 365/227, 229
See application file for complete search history.

(56) References Cited

U.S. PATENT DOCUMENTS

| | | | |
|---|---|---|---|
| 5,019,772 A | 5/1991 | Dreibelbis et al. | |
| 5,267,218 A | 11/1993 | Elbert | |
| 5,410,680 A | 4/1995 | Challa et al. | |
| 5,483,486 A | 1/1996 | Javanifard et al. | |
| 5,495,453 A | 2/1996 | Wociechowski et al. | |
| 5,530,640 A | 6/1996 | Hara | |
| 5,594,360 A | 1/1997 | Wojciechowski | |
| 5,651,011 A | 7/1997 | Keeth | |
| 5,657,284 A | 8/1997 | Beffa | |
| 5,663,918 A | 9/1997 | Javanifard et al. | |
| 5,671,179 A | 9/1997 | Javanifard | |
| 5,748,032 A | 5/1998 | Baek | |
| 5,874,849 A | 2/1999 | Marotta | |
| 5,885,846 A | 3/1999 | Beffa | |
| 5,966,025 A | 10/1999 | Beffa | |
| 5,991,851 A * | 11/1999 | Alwais et al. | 711/106 |
| 6,037,792 A | 3/2000 | McClure | |
| 6,154,851 A | 11/2000 | Sher et al. | |
| 6,181,154 B1 | 1/2001 | Beffa | |
| 6,240,027 B1 | 5/2001 | Lee | |
| 6,370,075 B1 | 4/2002 | Haeberli et al. | |
| 6,469,474 B2 * | 10/2002 | Bunker | 320/132 |
| 6,536,670 B1 * | 3/2003 | Postman et al. | 235/487 |
| 6,625,073 B1 | 9/2003 | Beffa | |

(Continued)

FOREIGN PATENT DOCUMENTS

JP    03058393    3/1991

(Continued)

*Primary Examiner*—Viet Q Nguyen
(74) *Attorney, Agent, or Firm*—Leffert Jay & Polglaze, P.A.

(57) ABSTRACT

A memory with an internal detection mechanism to detect the presence of either an external component of an external voltage on some no connect pins, allowing a change in the configuration of the internal voltage pumps based on those detections, or which can be used as a standard device as well. The embodiments allow the system to lower its card power consumption depending upon availability of other voltage sources in the system or available components such as inductors to provide internal voltages more efficiently.

21 Claims, 3 Drawing Sheets

U.S. PATENT DOCUMENTS

| | | |
|---|---|---|
| 6,717,855 B2 | 4/2004 | Underwood |
| 6,870,774 B2 * | 3/2005 | Roohparvar et al. ... 365/185.33 |
| 6,892,270 B2 * | 5/2005 | Roohparvar ................ 711/105 |
| 6,912,155 B2 | 6/2005 | Sakurai et al. |
| 7,196,958 B2 * | 3/2007 | Roohparvar ................ 365/226 |
| 2003/0115528 A1 | 6/2003 | Tanaka et al. |
| 2003/0202379 A1 | 10/2003 | Yoshimura |
| 2004/0165447 A1 | 8/2004 | Roohparvar |
| 2004/0199803 A1 | 10/2004 | Suzuki et al. |
| 2005/0219904 A1 | 10/2005 | Sakurai et al. |

FOREIGN PATENT DOCUMENTS

| | | |
|---|---|---|
| JP | 06096303 A | 4/1994 |
| JP | 2003208794 A | 7/2003 |

* cited by examiner

POWER EFFICIENT MEMORY AND CARDS

RELATED APPLICATION

This application is a Divisional of U.S. application Ser. No. 10/930,524 titled "POWER EFFICIENT MEMORY AND CARDS," filed Aug. 31, 2004 now U.S. Pat. No. 7,196,958 which is commonly assigned and incorporated herein by reference.

FIELD

The present invention relates generally to memories and in particular the present invention relates to low power consumption memories.

BACKGROUND

The memory devices used on cards such as flash cards in cameras and for transportable storage require voltages that are much higher than the supply voltages (Vcc) available. One such type of memory device today is NAND type flash memory. These types of memory devices require voltages as high as 20 Volts. The Vcc range of operation for these devices is also dropping with every new generation of device. This is in part because end systems are lowering power requirements and this is one way they achieve that goal. In order to supply sufficient voltages for operation of the devices, internal pumps are used to pump the supply voltages up to a suitable operating voltage. However, the internal pumps used for NAND memory devices are increasingly inefficient. For example, at a supply voltage of 1.6 Volts (which is typical in current devices), to generate even 5 to 6 volts, the efficiency of the charge pumps are about 15 percent (%). For the pump to generate 1 mA, it must draw on the order of 7 mA from the supply voltage source.

NAND devices are meant to be stand alone memory devices that need to operate from a single power supply, so manufacturers and assemblers have accepted low efficiency to maintain the standards to which industry expects. Typical pumps used on memory devices are Dixon pumps. These types of pumps have been around for years, and use capacitors and diodes to pump a supply voltage to higher voltages than the internal power supply available. There are other types of pumps that use inductors that are much more efficient. Those types of pumps have efficiencies that approach 80%. Therefore, one can see that such use could make power efficiency of the cards on which the devices are used much greater. However, this requires an external inductor which is not a part of the NAND stand-alone memory.

Since the NAND device needs to be stand alone to comply with industry standards and to allow it to be used across multiple platforms and by multiple manufacturers, the maintenance of standard efficiency pumps and common pin configurations for devices is desirable. However, on the cards used, there may be other voltages available for the card, other systems of the card, or the memory subsystem.

For the reasons stated above, and for other reasons stated below which will become apparent to those skilled in the art upon reading and understanding the present specification, there is a need in the art for flash memories and flash memory cards having lower power consumption.

DETAILED DESCRIPTION

Figure 1:
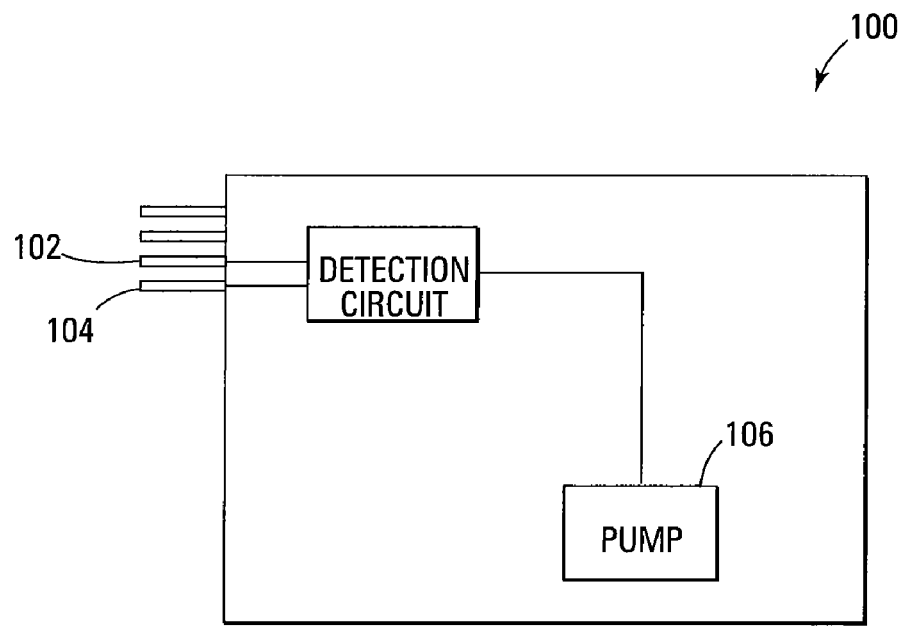
FIG. 1 is a block diagram of a memory card on which embodiments of the present invention may be practiced.

In the following detailed description of the invention, reference is made to the accompanying drawings that form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention.

The following detailed description is, therefore, not to be taken in a limiting sense, and the scope of the present invention is defined only by the appended claims, along with the full scope of equivalents to which such claims are entitled.

As is described in further detail below, a dual mode capable memory device or memory card is provided in various embodiments. The memory looks like, and can be operated like and connected like a standard stand-alone memory. However, if the memory is connected so that certain pins that are normally "no connect" pins are connected to a specific signal, voltage, or combination thereof, the memory operates in a second more efficient mode. Generally, the memory device or memory card operates off of a standard internal supply voltage except when a detection mechanism, detection signal, command signal or the like is provided or detected by the memory device or memory card. Upon a receipt of such a signal or upon a determination to use an external voltage or different internal voltage, or an external voltage in combination with an external inductor, the memory device and memory card embodiments of the present invention operate from the other voltage source, inductor, or combination thereof, alone or in conjunction with the standard internal supply voltage source.

In the embodiments of the present invention and the appended claims, a stand-alone memory device is defined as a memory that is configured with a pin out configuration substantially similar to an industry standard pin out configuration, and operates in a traditional operating manner when connected to an industry standard system. Such devices have certain pins that are present in the industry standard system but are not connected to any internal components of the memory. These are typically referred to as "no connect" pins. Such stand-alone memories include by way of example only and not by way of limitation, DRAM and SDRAM memories, flash memories, NAND type flash memories, and the like, that have a standard or substantially standard configuration of pins that connect the device to a system or the like.

One embodiment of a memory card 100 is shown in FIG. 1. Memory card 100 has a plurality of pins that are used for connection of the card 100 to a device such as a digital camera, a printer, a cellular telephone, or the like. Memory card 100 has a standard pin out configuration so that it is capable of use with systems that do not have extra power efficiencies. Two pins of the standard pin out configuration, here labeled 102 and 104, are traditionally "no connect" pins in a standard memory card. In the memory card 100, however, these pins 102 and 104 are connected internally in this embodiment to a detection circuit that detects whether a non-standard voltage is to be used with the card to increase efficiency of the internal voltage pump 106 of the card 100.

For example, if the memory card 100 is used in a cellular telephone memory that runs on 1.6 volts, but also contains a liquid crystal display (LCD) or the like that operates on a higher voltage, such as 3.0 volts, this higher voltage is in various embodiment supplied to the internal pump, which makes the memory or the memory card more efficient. Alternatively, a higher voltage is supplied through one of the two pins 102 or 104, while a signal indicating whether or not to use the external voltage is supplied on the other of the two pins 102 or 104.

Figure 2:
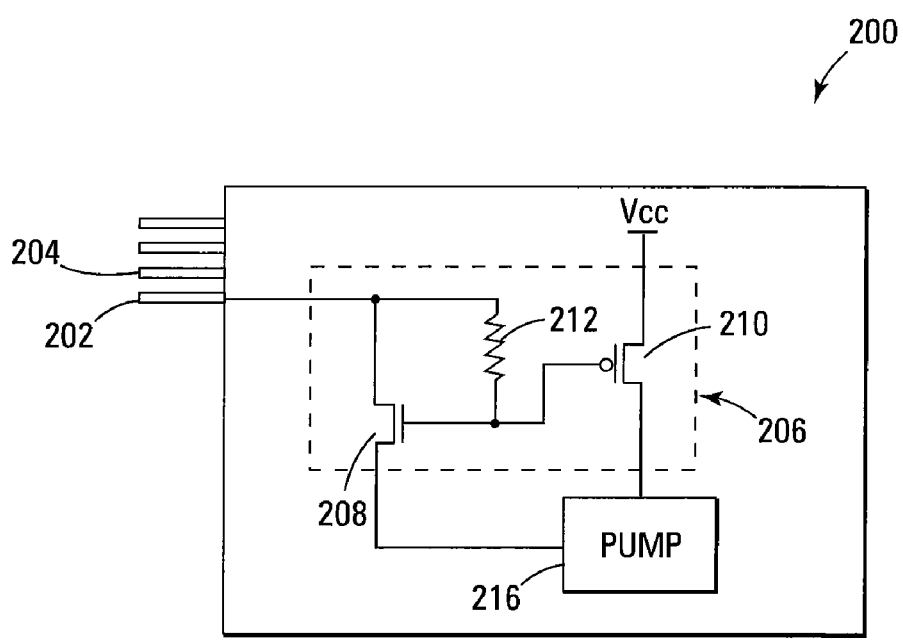
FIG. 2 is a block diagram of a memory card having a power efficient circuit of one embodiment of the present invention.

In another embodiment shown in FIG. 2, a memory card 200 is shown. Memory card 200 is configured with a pin out configuration that works with standard memory cards as well. An additional pin, 202, which is a "no connect" pin in a standard configuration, is used by this embodiment for power efficiency changes to the pump configuration of the memory card 200. In this embodiment, a hardware detection mechanism 206 is used to detect whether the memory card 200 is connected to some external power supply, external inductor, or combination thereof, that can be used for improved pump efficiency, or whether the standard internal pump configuration should be used.

Hardware detection system 206 comprises in one embodiment a pair of transistors 208 and 210 and a pull down resistor 212. The pull down resistor 212 is optional. The hardware detection system 206 is connected to pin 202, which is in turn either connected to an external voltage or not. The pin 202 is connected through resistor 212 to node 214. Node 214 is connected to the gate of n-type transistor 208 and to the gate of p-type transistor 210. If no external voltage device is connected to pin 202, or the pin is floating, then the voltage at node 214, through the resistor 212, will be substantially zero, indicating that no external device is connected to the pin 202. In this situation, the memory card 200 is configured to operate on its internal power supply Vcc, since transistor 210 is on and transistor 208 is off, providing supply voltage Vcc to pump 216. If pin 202 is connected to an external voltage, then the voltage at node 214 is sufficiently high to turn transistor 210 off and turn transistor 208 on, feeding the voltage at pin 202 to the pump 216.

It should be understood that the hardware detection mechanisms described herein can easily be varied to control which voltage is supplied to the internal pump. It should also be understood that in certain memories or memory cards, more than two possible voltages are selectively connectable to the internal pump, and that in other embodiments, a plurality of potential voltages are detected and the highest or most suitable voltage for operation of the pump is supplied to the pump. Selection of the voltage to be supplied to the pump is made in various embodiments through hardware, firmware, software, or through the use of a command signal provided by the memory controller. The hardware detection mechanism of this embodiment can also detect the presence on another pin of an external inductor, and can reconfigure the operation of the device to use the external inductor alone or in combination with the external voltage, to provide higher efficiencies. In one embodiment, when both an external voltage and an external inductor are detected, the external voltage is used to boost the efficiency of the internal voltage pump, and the external inductor is used with the pumped voltage to even further increase efficiency.

Figure 3:
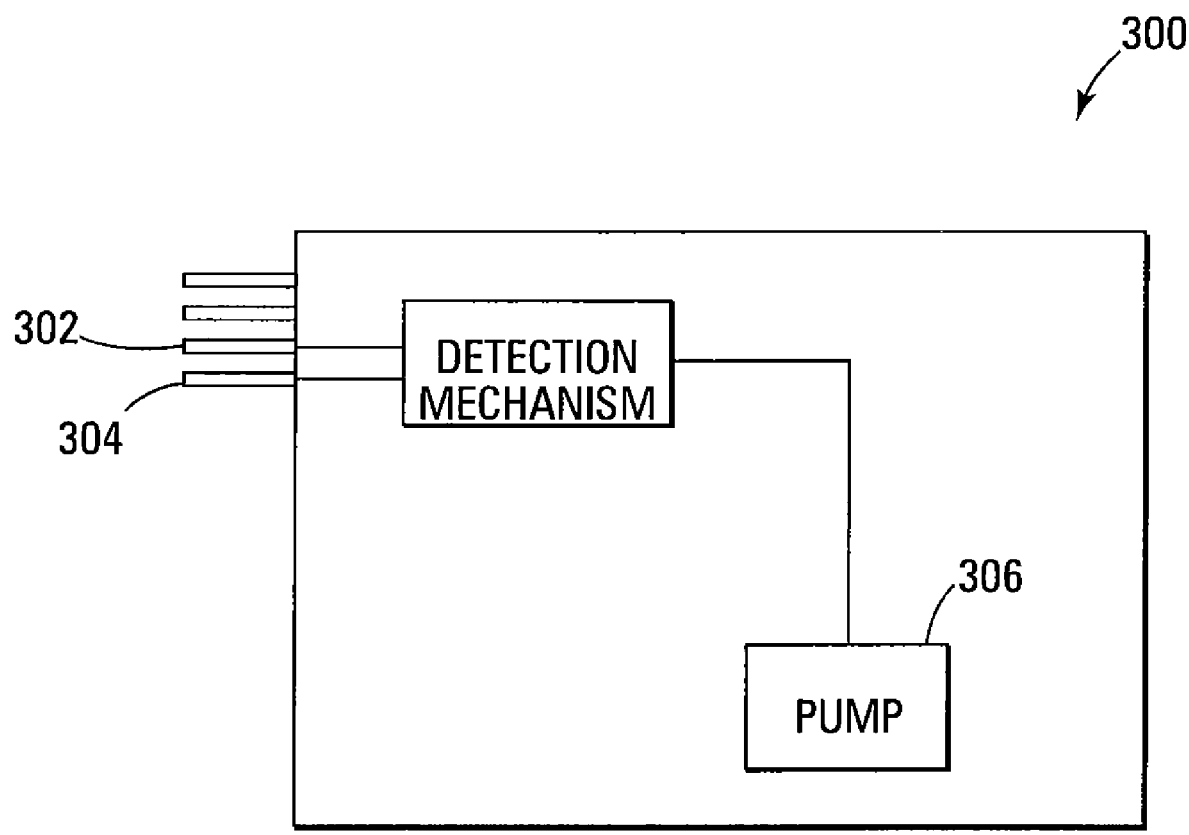
FIG. 3 is a block diagram of a memory card according to another embodiment of the present invention.

In another embodiment 300 shown in FIG. 3, external pin 302 is used as a detection mechanism only, and the pin 304 is tied to either an external voltage or to an inductor. In this embodiment, the card 300 ties the detection pin 302 to a low signal if the internal pump 306 is to be used. There are two external options possible in this embodiment that are tied to pin 304. If one of the two external options is to be used, the card 300 ties pin 302 to a high signal. The memory then know from the high signal at the detection pin 302 that some external form of assistance is to be used. Then, a voltage detection mechanism can be used to determine which type of assistance device is tied to the pin 304.

If the voltage detection mechanism detects a high, it concludes that a power supply is connected to the pin, and uses that pin as the new supply for the pump making the pump more efficient and improving power performance of the card. If there is simply an inductor hanging off the pin, there is no voltage to detect and the memory concludes that there is an inductor on the pin. The memory device of the present embodiment then re-configures its pump to use the inductor instead of the internal pump, again giving the system much better power efficiency, or to run the internal pump from the inductor in another embodiment. In another embodiment, the external inductor is used along with an internal voltage higher than the supply voltage.

In yet another embodiment, two traditionally "no connect" pins are connectable to an external voltage and an external inductor. The memory still has a standard pin out configuration and is operable as a stand alone traditional memory when it is connected in a traditional system. Upon detection of the presence of one or the other on the external pins, the device operates using the one external element connected as has been described above with respect to each component individually. However, when both an external inductor and an external voltage are connected to the pins, both are used. In one embodiment, the external voltage is provided to the internal pump to provide a higher efficiency pumped voltage, and then that voltage is used with the external inductor to provide an even more efficient operation.

The embodiments of the present invention use a memory having standard pin out connections, but which has extra features that are enabled allowing the memory to be run more efficiently while not losing its standard references when an external voltage or other voltage supplying component is connected to the system.

In the various configurations of memory cards described above, when the card includes a standard pin configuration with two extra, traditionally "no connect" pins, a resistive pulldown can be used as described. If there is a pullup pin on the system, that pin connected to the resistive pulldown is internally low, and the memory card operates in a normal mode of operation like any other NAND memory card. Because the cards operate with a normal pin out configuration, they are usable in standard systems not configured to use a higher voltage supply for the internal pump. The two extra pins are "no connects" on the system. However, in systems that are configured to use an external or different internal power supply, the cards can be so used.

Alternatively, a single external power assistance mechanism or voltage is tied to the pin 304, and once the detection pin 302 is tied to a high signal, the single assistance mechanism tied to pin 304 is used to provide a starting voltage for the pump 306.

The embodiments of the present invention are all capable of being connected to and of running in standard systems, since the only components that affect behavior are on "no connect" pins in a standard configuration for memories and memory cards. It is only when a command or indication is sent to the memory or memory card, or when an external voltage is connected to or detected by the pins of the various embodiments that operation is commenced in the new modes.

In all of the embodiments of the present invention, a combination of external assistance and the internal supply voltage Vcc may be used without departing from the scope of the invention. In yet another embodiment, a voltage higher than the supply voltage Vcc may be present to operate other components of the system in which a memory card such as cards 100, 200 or 300 are to be used. Such other voltages include, but are not limited to, a display screen voltage supply, an internal battery supplying power, or the like. In such a configuration, it is a simple matter to modify the circuits and embodiments of the present invention to provide the other internal voltage to the internal pump, or to use an externally connected inductor in combination with the other internal voltage. Such modifications will be understood by those skilled in the art, and are within the scope of the present invention and embodiments.

The memory devices of the various embodiments of the present invention are configurable through a command from the controller during initial setup. This command in another embodiment is supplied right before a programming or an erase operation. The command in one embodiment tells the memory device to use either a supply from outside the card or to use an externally connected inductor instead of the internal pump.

Figure 4:
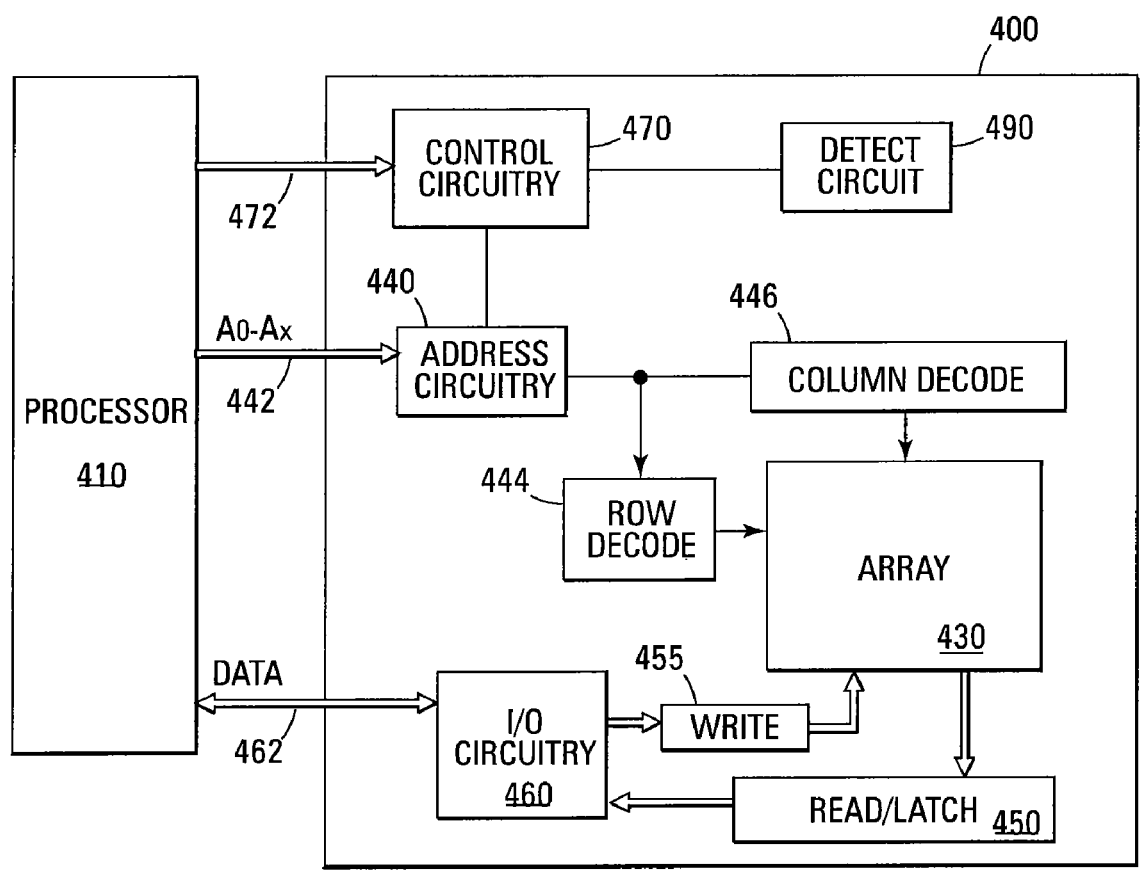
FIG. 4 is a block diagram of a memory on which embodiments of the present invention may be practiced.

Still further embodiments of the present invention include memory devices that use the concepts herein. For example, a memory suitable for use with the embodiments of the present invention is shown in FIG. 4, which is a functional block diagram of a memory device 400, such as a flash memory device, of one embodiment of the present invention, which is coupled to a processor 410. The memory device 400 and the processor 410 may form part of an electronic system 420. The memory device 400 has been simplified to focus on features of the memory that are helpful in understanding the present invention. The memory device includes an array of memory cells 430. The memory array 430 is arranged in banks of rows and columns.

An address buffer circuit 440 is provided to latch address signals provided on address input connections A0-Ax 442. Address signals are received and decoded by row decoder 444 and a column decoder 446 to access the memory array 430. It will be appreciated by those skilled in the art, with the benefit of the present description, that the number of address input connections depends upon the density and architecture of the memory array. That is, the number of addresses increases with both increased memory cell counts and increased bank and block counts.

The memory device reads data in the array 430 by sensing voltage or current changes in the memory array columns using sense/latch circuitry 450. The sense/latch circuitry, in one embodiment, is coupled to read and latch a row of data from the memory array. Data input and output buffer circuitry 460 is included for bi-directional data communication over a plurality of data (DQ) connections 462 with the processor 410, and is connected to write circuitry 455 and read/latch circuitry 450 for performing read and write operations on the memory 400. Command control circuit 470 decodes signals provided on control connections 472 from the processor 410. These signals are used to control the operations on the memory array 430, including data read, data write, and erase operations. The flash memory device has been simplified to facilitate a basic understanding of the features of the memory. A more detailed understanding of internal circuitry and functions of flash memories are known to those skilled in the art. Detection circuit 490 is used in one embodiment to detect whether to use an internal voltage pump (not shown) or to use an external voltage supply or inductor as has been described above in the various embodiments of the present invention. The embodiments described above are used in various embodiments in the basic memory array or system structure described in FIG. 4.

CONCLUSION

The various embodiments of the invention include a memory with an internal detection mechanism to detect the presence of either an external component of an external voltage on some no connect pins, allowing a change in the configuration of the internal voltage pumps based on those detections, or which can be used as a standard device as well. The embodiments allow the system to lower its card power consumption depending upon availability of other voltage sources in the system or available components such as inductors to provide internal voltages more efficiently.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. A method of operating a dual mode stand-alone memory card, comprising:
    operating in a normal power mode in which an internal supply voltage is connected to an internal pump when no external power supply is provided to operate the internal pump; and
    operating in a power efficient mode when an external component is provided, on a pin that is a no-connect pin in a pin out configuration substantially similar to an industry standard pin out configuration, to operate the internal pump.

2. The method of claim 1, wherein operating in a power efficient mode comprises:
    determining whether the external component is an inductor or an external voltage supply;
    operating from the inductor and the internal supply voltage if the inductor is the external component; and
    operating the internal pump using the external voltage supply if the external voltage supply is the external component.

3. The method of claim 1, and further comprising:
    determining when an external voltage is provided; and
    switching to the external voltage when it is determined to be provided.

4. The method of claim 3, wherein determining when an external voltage is provided comprises:
    receiving a command from a memory controller indicating which of the internal voltage and the external voltage to use to operate an internal pump of the memory device; and
    operating the internal pump from the commanded voltage supply.

5. The method of claim 1, and further comprising:
    detecting with a detection circuit whether to use an external voltage or an internal voltage.

6. The method of claim 5, wherein detecting comprises:
    monitoring a voltage level on a connect pin; and
    switching from the normal operation mode when a voltage on the connect pin exceeds an internal supply voltage.

7. The method of claim 5, wherein detecting comprises:
monitoring an enable pin; and
switching to operation from an external component connected to a supply pin when a signal on the enable pin enables the power efficient mode of operation.

8. The method of claim 7, wherein switching to operation from an external component comprises:
determining whether external voltage is an inductor or an external supply;
operating from the inductor and the internal supply voltage if the inductor is the external component; and
operating the internal pump from the external supply if the external supply is the external component.

9. A method of operating a dual mode stand-alone memory card, comprising:
operating in a normal power mode in which an internal supply voltage is connected to an internal pump when no external power supply is provided to operate the internal pump; and
switching to operation in a power efficient mode when an external component is provided on at least one of two pins, each of the two pins being a no-connect pin in a pin out configuration substantially similar to an industry standard pin out configuration, to operate the internal pump.

10. The method of claim 9, wherein switching to operation from an external component comprises:
determining whether an external component is connected to the first pin, the second pin, or both pins;
operating from the connected external pin when an external component is connected to one of the first or the second pins; and
operating from both of the external components when an external component is connected to each of the first and the second pins.

11. A method of operating a memory device, comprising:
receiving a command from a memory controller indicating which of a plurality of voltage supplies to use to operate in a power efficient mode of the memory device; and
operating the internal pump according to the power efficient mode using the voltage supply indicated by the command.

12. The method of claim 11, wherein operating in a power efficient mode comprises:
determining whether the voltage supply indicated by the command is an internal high voltage supply or an external component;
using the internal high voltage supply to provide voltage to the internal pump when the voltage supply indicated by the command is the internal high voltage supply; and
using the external component when the external component is the voltage supply indicated by the command.

13. The method of claim 12, wherein using the external component further comprises:
determining whether the external component is an inductor or an external voltage supply;
operating from the inductor and the internal high voltage supply if the inductor is the external component; and
operating the internal pump using the external voltage supply if the external voltage supply is the external component.

14. A method of operating a dual mode memory card, comprising:
operating in a normal power mode in which an internal supply voltage is connected to an internal pump when no external power supply is provided to operate the internal pump; and
operating in a power efficient mode when an external component is provided to operate the internal pump.

15. A method of operating a stand-alone memory card, comprising:
operating in a first operating mode using an internal power supply voltage;
monitoring a memory card pin for an operating mode change signal; and
changing operation to a second operating mode more efficient than the first operating mode when the operating mode change signal is received.

16. The method of claim 15, wherein monitoring comprises:
detecting an external component connected to the memory card pin using a detection mechanism.

17. The method of claim 15, wherein operating in a first operating mode comprises:
passing an internal supply voltage to an internal voltage pump of the memory card.

18. The method of claim 15, wherein changing operation comprises:
passing an external voltage on the memory card pin to an internal voltage pump of the memory card when an external voltage is detected on the memory card pin.

19. The method of claim 18, wherein changing operation further comprises:
comparing the external voltage to a voltage of the internal voltage pump, and changing only when the external voltage exceeds the voltage of the internal voltage pump.

20. The method of claim 15, wherein changing operation comprises:
passing an external voltage to the memory card on a memory card supply pin that is a no-connect pin in an industry standard pin out configuration memory card pin when an external detection signal is detected on a to an internal voltage pump of the memory card when an external voltage is detected on a memory card connect pin that is a no connect pin in an industry standard pin out configuration.

21. The method of claim 16, and further comprising:
detecting a presence of an external conductor on a second connect pin; and
reconfiguring operation of the device in the second operating mode to use either the external inductor alone or in combination with the external voltage.

* * * * *